(12) United States Patent
Saito et al.

(10) Patent No.: US 6,514,122 B2
(45) Date of Patent: Feb. 4, 2003

(54) SYSTEM FOR MANUFACTURING SEMICONDUCTOR DEVICE UTILIZING PHOTOLITHOGRAPHY TECHNIQUE

(75) Inventors: Takayuki Saito, Tokyo (JP); Tadashi Miyagi, Tokyo (JP); Takuya Matsushita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/773,497

(22) Filed: Feb. 2, 2001

(65) Prior Publication Data

US 2002/0048857 A1 Apr. 25, 2002

(30) Foreign Application Priority Data

Aug. 3, 2000 (JP) ........................................ 2000-235293

(51) Int. Cl.[7] ........................... B24D 49/00; B24D 51/00
(52) U.S. Cl. ..................... 451/5; 451/6; 451/8; 451/412
(58) Field of Search ............................... 438/140; 451/5, 451/6, 8, 29–31, 41, 54, 55, 63, 64, 411, 412, 559; 430/5, 22, 311, 396; 216/88, 89

(56) References Cited

U.S. PATENT DOCUMENTS

| | | | |
|---|---|---|---|
| 4,780,616 A | * 10/1988 | Nishi et al. .................. 356/400 |
| 5,080,482 A | * 1/1992 | Benz et al. .................. 451/240 |
| 5,300,786 A | * 4/1994 | Brunner et al. ............. 356/401 |
| 5,661,546 A | * 8/1997 | Taniguchi .................... 355/30 |
| 5,985,495 A | * 11/1999 | Okumura et al. ............. 430/22 |
| 6,003,223 A | * 12/1999 | Hagen et al. ................. 451/31 |
| 6,110,021 A | * 8/2000 | Ota et al. .................... 451/159 |
| 6,226,074 B1 | * 5/2001 | Fujisawa et al. ............... 430/5 |

FOREIGN PATENT DOCUMENTS

JP           09-092606         4/1997

* cited by examiner

Primary Examiner—Timothy V. Eley
(74) Attorney, Agent, or Firm—McDermott, Will & Emery

(57) ABSTRACT

A product pattern and a test pattern for managing a focus offset value are patterned onto a product wafer by means of exposure, and is patterned onto the product wafer by means of exposure. The exposed product wafer is developed. A measurement section measures the dimension of the test pattern patterned on the product wafer. On the basis of the thus-measured dimension of the test pattern, the focus offset value set in a system for manufacturing a semiconductor device is computed by a computation section. The focus offset value set in a projection optical system of the system for manufacturing a semiconductor device is adjusted by means of an adjustment section so as to become identical with the computed focus offset value.

5 Claims, 4 Drawing Sheets

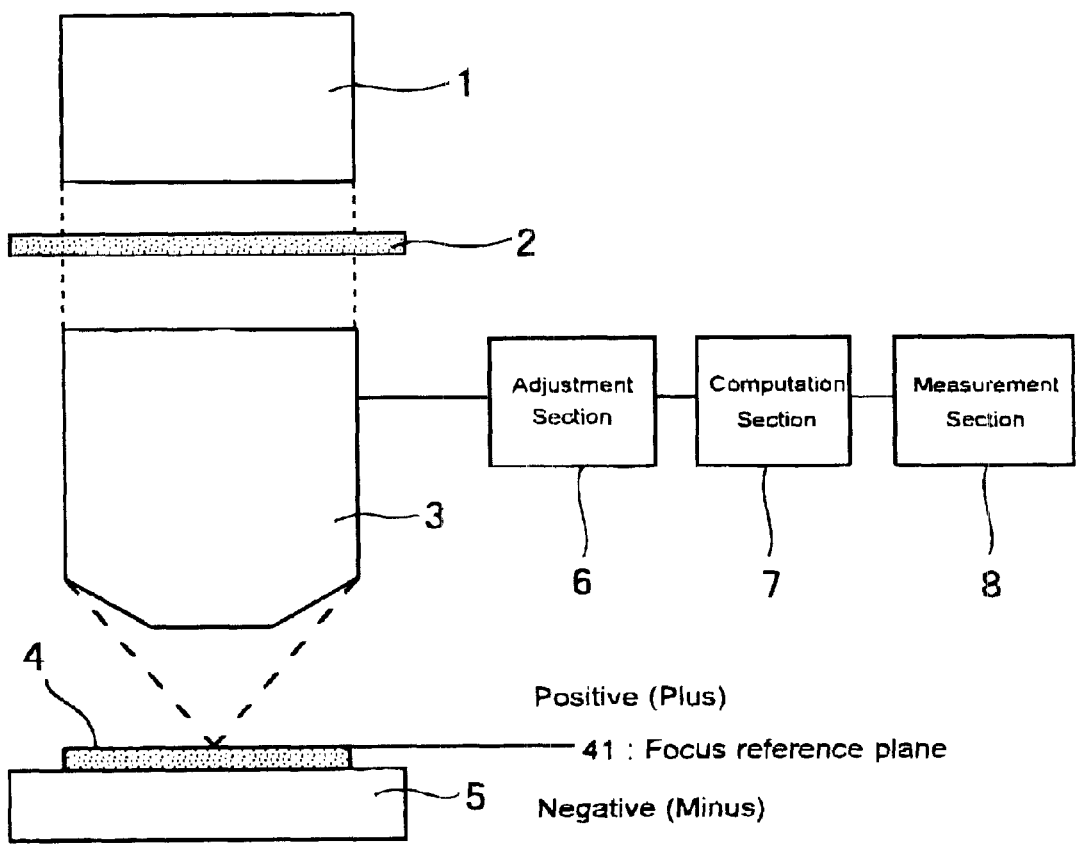

SYSTEM FOR MANUFACTURING SEMICONDUCTOR DEVICE UTILIZING PHOTOLITHOGRAPHY TECHNIQUE

BACKGROUND OF THE INVENTION

1. Field of the Invention

The present invention relates to a system for manufacturing a semiconductor and to a method of manufacturing a semiconductor, and more particularly, to management of a focus offset value employed during a lithography process.

2. Description of the Background Art

During a lithography step in a process of manufacturing a semiconductor device, an aligner has already been used as a system for manufacturing a semiconductor device, which the system utilizes the photolithography technique.

FIG. 6 is a cross-sectional view for describing a conventional system for manufacturing a semiconductor device.

The system for manufacturing a semiconductor device shown in FIG. 6 substantially comprises an illumination system 1, which is a light source for emanating exposure light; a reticle 2 having an exposure pattern drawn thereon; and a projection optical system 3 for radiating, in a scaled-down manner and onto a wafer 4 supported on a stage 5, the light that has passed through the reticle 2.

Reference numeral 41 designates a focus reference plane and shows the surface of a photoresist film (not shown) formed on the wafer 4. The light projected by the projection optical system 3 is focused onto the focus reference plane 41 of the wafer 4.

In a case where a focus is shifted to a position located above the focus reference place 41, a positive focus offset value is set to the projection optical system 3. Thus, the focus is aligned with the focus reference plane 41 of the water 4.

In contrast, if a focus is shifted to a position located below than the focus reference plane 41, a negative focus offset value is set to the projection optical system 3, thus aligning the focus with the focus reference plane 41.

As mentioned above, in the system for manufacturing a semiconductor device, a management of the focus offset value of the projection optical system 3 is important for accurate transfer. on to the wafer 4, of the exposure pattern drawn on the reticle 2.

Next will be described a conventional method of managing a focus offset value.

A manufacturing operation of the system for manufacturing a semiconductor device is ceased, and a bare silicon wafer 4, which is coated with resist on one side, is placed on the stage 5. A reticle 2 for use in manufacturing a product is replaced with a reticle 2 having drawn thereon a test pattern for managing a focus offset value.

The test patterns are patterned onto a plurality of positions on the wafer 4 through exposure while focus offset values are taken as parameters.

Specifically, the test pattern is patterned onto the wafer 4 through exposure while the first focus offset value (for example, +0.3 μm) is used. Next, the test pattern is again patterned in the vicinity of the area where the test pattern has been patterned by use of the first focus offset value, by means of exposure and through use of a second focus offset value (for example, +0.2 μm). Next, the test pattern is patterned onto the wafer 4 a plurality of times through use of the remaining focus offset values (for example, +0.1 μm, 0, -0.1 μm, -0.2 μm, and -0.3 μm).

Thus, a plurality of test patterns are formed on the wafer 4 while different focus offset values are used.

Next, the wafer 4, on which the test patterns have been patterned by means of exposure and through use of the plural focus offset values, is developed. As a result, a plurality of test patterns corresponding to the plurality of focus offset values (-0.3 μm to +0.3 μm) are formed on the wafer 4.

Next, the dimensions of the respective test patterns formed on the wafer 4 are measured through use of a critical dimension measurement SEM. If the dimensions of the test patterns satisfy standards, the maximum focus offset value and the minimum focus offset value are determined. A center value between the maximum and minimum focus offset values is managed as an optimum focus offset value.

In a case where test patterns are patterned through exposure for the purpose of leveling the stage 5, a test pattern must be patterned onto a plurality of locations on the wafer 4 by means of exposure and through use of the previously-described focus offset values.

In order to manage a focus offset value, the conventional system for manufacturing a semiconductor device must periodically cease production. The management of a focus offset value involves repeated patterning of a pattern through use of different offset values a plurality of times and measurement of the thus-patterned patterns, thus consuming much time.

This results in an increase in down time of the system for manufacturing a semiconductor device, thus deteriorating an availability factor of the system for manufacturing a semiconductor device. Accordingly, there arises a problem of an increase in the cost of manufacturing a semiconductor device.

The management of a focus offset value is performed periodically. However, in the event that a variation arises in the focus offset value during a period between the periods of management, there is no way to find the variation until anomalous products are found.

In order to level the stage 5, patterns must be patterned onto different locations on a wafer by means of multiple shots and through use of a single focus offset value. Similarly, patterns must be patterned onto a wafer by means of a plurality of shots through use of different focus offset values.

Thus, a long period of time is required for multiple shots and measuring the dimensions of patterns that have been developed. Therefore, the stage 5 can not be leveled easily.

SUMMARY OF THE INVENTION

The present invention has been conceived to solve the previously-mentioned problems and a general object of the present invention is to provide a novel and useful system for manufacturing a semiconductor device, and is to provide a novel and useful method of manufacturing a semiconductor device, and is to provide a semiconductor device manufactured by the method.

A more specific object of the present invention is to manage a focus offset value without suspending manufacture of a semiconductor device in a system for manufacturing a semiconductor device.

Another more specific object of the present invention is to monitor a focus offset value even during a period of time between periods of management of a focus offset value Another more specific object of the present invention is to level a stage for supporting a product wafer easily.

The above objects of the present invention are attained by a following system for manufacturing a semiconductor device, and by a following method of manufacturing a semiconductor device.

According to one aspect of the present invention, the system for manufacturing a semiconductor device comprises a stage for supporting a product wafer; an illumination system for emanating exposure light; a reticle which has drawn thereon a test pattern for managing a focus offset value and a product pattern, and through which the light originating from the illumination system passes; a projection optical system for projecting, onto the product wafer and at a desired focus offset value, the light that has passed through the test pattern and the product pattern drawn on the reticle; and an adjustment section for adjusting the focus offset value of the projection optical system on the basis of a measurement result of dimension of the test pattern, which pattern is patterned onto the product wafer through exposure.

In the system for manufacturing a semiconductor device, since a management of a focus offset value can be carried out in conjunction with manufacture of semiconductor products, the availability factor of the system for manufacturing a semiconductor device can be improved.

According to another aspect of the present invention, in a manufacturing method of a semiconductor device, a product pattern is patterned onto a product wafer through exposure as well as patterning a test pattern for managing a focus offset value through exposure in an exposure step. Next, the product wafer exposed in the exposure step is developed in a development step. Further, a dimension of the test pattern developed in the development step is measured in a measurement step. Next, a focus offset value of a system for manufacturing a semiconductor device is computed on the basis of the dimension of the test pattern measured in the measurement step.

In the method of manufacturing a semiconductor device, since the focus offset value can be managed in conjunction with manufacture of semiconductor products, thereby improving the availability factor of a system for manufacturing a semiconductor device.

Other objects and further features of the present invention will be apparent from the following detailed description when read in conjunction with the accompanying drawings.

BRIEF DESCRIPTION OF THE DRAWINGS

FIG. 1 is a cross-sectional view for describing a system for manufacturing a semiconductor device, according to a first embodiment of the present invention;

DETAILED DESCRIPTION OF THE PREFERRED EMBODIMENTS

Figure 2A:
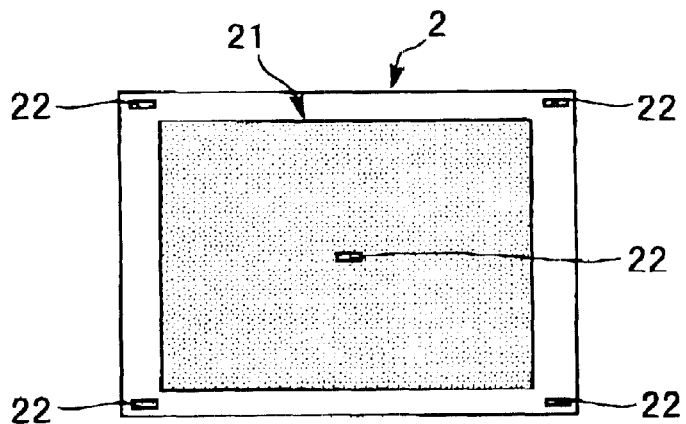
FIG. 2A is a view for describing a reticle, according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a cross-sectional view for describing a method of manufacturing a semiconductor device, according to the embodiment of the present invention.

As shown in FIG. 1, a system for manufacturing a semiconductor device essentially comprises an illumination system 1; a reticle 2; a projection optical system 3; a stage 5 for supporting a product wafer 4; an adjustment section 6; a computation section 7; and a measurement section 8.

The illumination system 1 is a light source for emanating light used for exposing a pattern. On the reticle 2 are drawn a product pattern (which will be described later) and a test pattern used for managing a focus offset value. The reticle 2 permits transmission of the light originating from the illumination system 1.

Figure 2B:
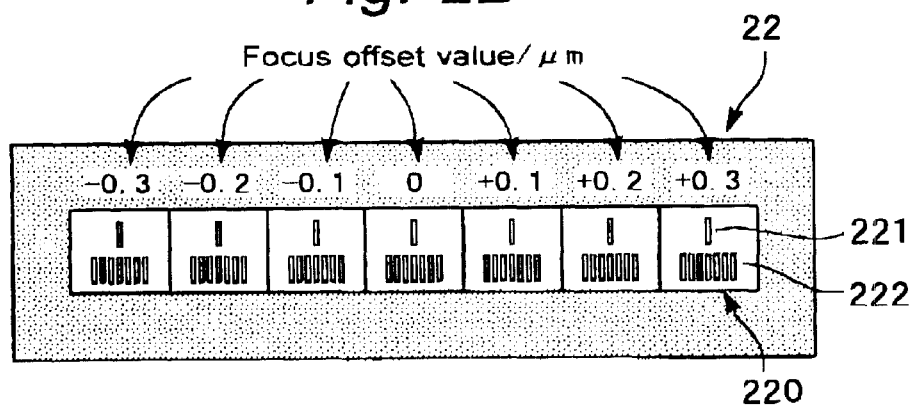
FIG. 2B is a view for describing a test pattern, according to a first embodiment of the present invention.
Figure 2C:
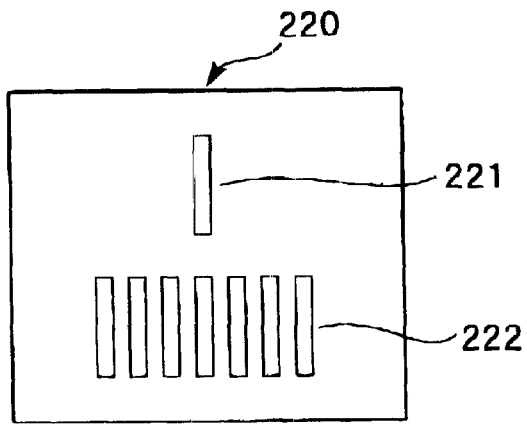
FIG. 2C is a view for describing a test pattern, according to a first embodiment of the present invention.

With reference to FIGS. 2A to 2C, the reticle 2 will now be described.

As shown in FIG. 2A, a product pattern 21 and a plurality of test patterns 22 are drawn on the reticle 2.

As shown in FIG. 2B, each of the test patterns 22 comprises a plurality of test patterns 220 corresponding to respective focus offset values (ranging from +0.3 $\mu$m to –0.3 $\mu$m, as illustrated).

Here, in a case where the focus offset value of the projection optical system 3 is set to a value of, for example, +0.3 $\mu$m, and light is radiated onto a product wafer 4, a plurality of test patterns 220 corresponding to respective focus offset values (–0.3 $\mu$m to +0.3 $\mu$m) are patterned onto the product wafer 4. More specifically, the test pattern 22 shown in FIG. 2B is patterned on the product wafer 4.

Next, the product wafer 4 is developed. Thus, the plurality of test patterns 220 is formed on the product wafer 4.

Next, the test pattern 220, which corresponds to a focus offset value of +0.3 $\mu$m and is formed at the right end of row of test patterns 220 on the test pattern 22 shown in FIG. 2B, is only measured.

More specifically, after developing, the dimension of only the test pattern 220, which the pattern 220 corresponds to the focus offset value set on the projection optical system 3, is measured.

As shown in FIGS. 2B and 2C, the test pattern 220 comprises a first test pattern 221 and a second test pattern 222.

Here, the first test pattern 221 is an isolated line pattern having a line width of, for example, 0.24 $\mu$m. The second test pattern 222 corresponds to a line/space pattern having a line width of 0.24 $\mu$m and a line pitch (space) of 0.24 $\mu$m.

Figure 3:
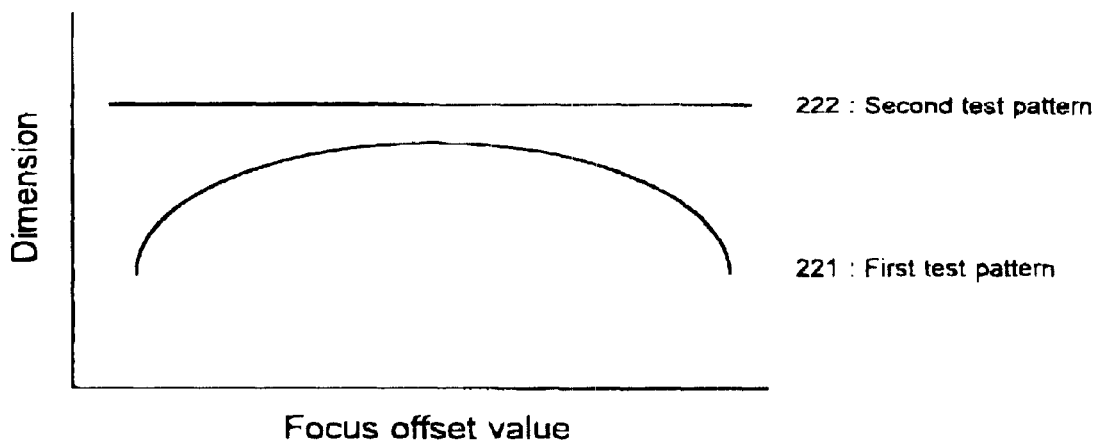
FIG. 3 is a drawing for describing a relation between a focus offset value and a dimension of a test pattern, according to a first embodiment of the present invention.

As shown FIG. 3, the dimensions of the first test pattern 221 and the second test pattern 222 are changed with a variation in the focus offset value of the projection optical system 3. Namely, in a case where the focus offset value of the projection optical system 3 is shifted, the dimensions of the test patterns 221 and 222 are changed.

The first test pattern 221 is a test pattern whose dimension changes greatly with a change in the focus offset value. In contrast, the second test pattern 222 is a test pattern whose dimension changes little with a change in the focus offset value.

A plurality of test patterns 22 is drawn on the reticle 2 in a plurality of locations (at the four corners shown in FIG. 2A). The plurality of test patterns 22 is used for leveling the stage 5. Thus, the plurality of test patterns 22 required for leveling purposes are simultaneously patterned onto the produce wafer 4 by means of a single shot. More specifically, the plurality of test patterns 22 are simultaneously patterned in a plurality of locations on the product wafer 4 (within a single shot area).

The projection optical system 3 projects, onto the product wafer 4 supported by the stage 5 in a scaled-down manner and at a desired focus offset value, the light that has been transmitted through the product pattern 21 and the test patterns 22 of the reticle 2. The focus offset value of the projection optical system 3 is adjusted by the adjustment section 6.

The product wafer 4 is supported by the stage 5.

The stage 5 is leveled by means of an unillustrated adjustment section such that the projection optical system 3 is made parallel with the focus reference plane 41 of the product wafer 4.

Reference numeral 41 designates a focus reference plane; that is, the surface of a photoresist film (not shown) formed on the wafer 4. The light which has been projected by the projection optical system 3 is focused on the focus reference plane 41 of the product wafer 4.

When a focus is shifted to a position (positive (Plus) shown in FIG. 1) located above the focus reference plane 41, the focus offset value of the projection optical system 3 is adjusted to a positive value by means of the adjustment section 6, thereby aligning the focus to the focus reference plane 41. In contrast, if a focus is shifted to a position (Negative (Minus) shown in FIG. 1) located below the focus reference plane 41, the focus offset value of the projection optical system 3 is adjusted to a negative value by means of the adjustment section 6, thereby aligning the focus to the focus reference plane 41.

The adjustment section 6 is connected to the projection optical system 3 and the computation section 7. On the basis of the focus offset value computed by the computation section 7; that is, the focus offset value which is computed by the computation section 7 from the dimension of the test pattern determined by the measurement section 8, the adjustment section 6 adjusts the focus offset value of the projection optical system 3.

The computation section 7 is connected to the adjustment section 6 and the measurement section 8. As will be described in detail later, the computation section 7 computes a dimensional difference (i.e., Lb−La, which will be described later) from the dimension of a test pattern (i.e., La and Lb, which will be described later) measured by the measurement section 8. The focus offset value is further computed from the thus-computed dimensional difference by the computation section 7. On the basis of a dimension Lbt (which will be described later) of the test pattern measured by the measurement section 8, the computation section 7 determines the direction in which the focus offset value has been shifted.

The computation section 7 outputs the focus offset value, which is a computation result, to the adjustment section 6.

The measurement section 8 is connected to the computation section 7. The measurement section 8 corresponds to, for example, a critical dimension measurement SEM for measuring the dimensions (La, Lb, and Lbt, which will be described later) of respective test patterns formed on the product wafer 4.

The measurement section 8 outputs the thus-measured dimensions of the test patterns to the computation section 7.

As described above, in the system for manufacturing a semiconductor device according to the first embodiment of the present invention, the light emanated from the illumination system 1 is caused to pass through the reticle 2 having drawn thereon the product pattern 21 and the test pattern 22 for managing a focus offset value. The projection optical system 3 projects the light that has passed through the reticle 2 onto the product wafer 4 of the stage 5 at a desired focus offset value.

As a result, the product pattern 21 and the test pattern 22 for managing a focus offset value are simultaneously patterned onto the product wafer 4. The test pattern 22 comprises the first test patterns 221 whose dimensions change greatly with a change in the focus offset value, and the second test patterns 222 whose dimensions change little with a change in the focus offset value.

The measurement section 8 measures the dimension (i.e., La which will be described later) of each of the first test patterns 221 and the dimension (i.e., Lb which will be described later) of each of the second test patterns 222. Here, the first test patterns 221 and the second test patterns 222 are formed on the product wafer 4.

The computation section 7 computes a dimensional difference (i.e., Lb−La, which will be described later) from the dimensions of the respective test patterns 221 and 222 measured by the measurement section 8. On the basis of the thus-computed dimensional difference, the computation section 7 computes a focus offset value.

Accordingly, the focus offset value can be managed in conjunction with manufacture of a semiconductor. Thus, down time of the system for manufacturing a semiconductor device can be shortened. Thus, the availability factor of the system for manufacturing a semiconductor device can be improved to a much greater extent.

The focus offset value computed by the computation section 7 is fed back to the adjustment section 6, and the adjustment section 6 adjusts the focus offset value of the projection optical system 3. Accordingly, when a pattern is patterned onto the product wafer 4 of the next lot through exposure, the thus-computed focus offset value can be reflected. As a result, the focus offset value of the projection optical system 3 can be managed in real time.

In connection with each of the test patterns 22 patterned onto a plurality of locations on the product wafer 4 (within a single shot area), a focus offset value is computed, and the stage 5 is leveled on the basis of the thus-computed focus offset values.

At this time, since the test patterns 22 are drawn in a plurality of locations on the reticle 2, the test patterns 22 can be easily patterned onto the reticle 2 by means of a single shot, which operation has, until now, been performed by means of multiple shots.

Thus, the exposure time required for leveling the stage 5 can be shortened, wherewith the stage 5 can be leveled easily.

The computation section 7 and the measurement section 8, which are constituent elements of the system for manufacturing a semiconductor device according to the first embodiment, may be disposed outside the system for manufacturing a semiconductor device.

The adjustment of a focus offset value, which is usually performed by the adjustment section 6, may be performed by an operator on the basis of the result of the computation performed by the computation section 7.

Second Embodiment

Next will be described a method of manufacturing a semiconductor device according to a second embodiment of the present invention. More particularly, there will be described a method of managing a focus offset value.

Here, the expression "system for manufacturing a semiconductor device" refers to the system for manufacturing a semiconductor device according to the first embodiment.

Figure 4:
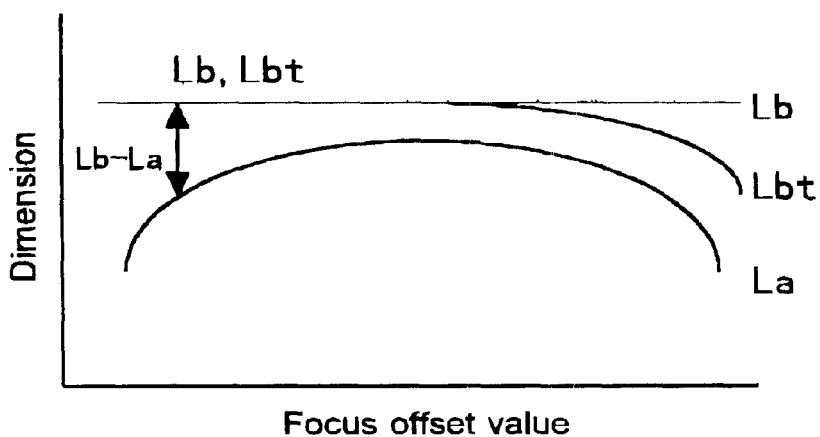
FIG. 4 is a drawing for describing a relation between a focus offset value and a dimension of a test pattern, according to a second embodiment of the present invention.

FIG. 4 is a drawing for describing a relation between a focus offset value and a dimension of a test pattern, according to a second embodiment of the present invention.

A plot showing the relation between a focus offset value and a test pattern, such as that shown in FIG. 4, is prepared in the following manner before management of a focus offset value.

First, the test patterns 22 are patterned onto different locations on a wafer by means of exposure through use of the reticle 2 shown in FIG. 2 while the focus offset value is changed in increments of 0.1 μm within the range of −0.3 μm to +0.3 μm. As a result, the test patterns 22 are patterned onto the respective locations on the wafer with different focus offset values.

Here, each of the test patterns 22 comprises isolated line patterns, which correspond to the first test patterns 221 and have a line width of 0.24 μm, and line/space patterns, which correspond to the second test patterns 222 and have a line width of 0.24 μm and a line pitch (space) of 0.24 μm.

Since the product pattern 21 of the reticle 2 is irrelevant to the following description about management of a focus offset value, the following description will refer solely to the test pattern 22. Further, the stage 5 is leveled in advance.

The wafer may be embodied by either the product wafer 4 or a bare silicon wafer coated with resist. Preferably, the resist is identical in type with the product wafer.

Next, the wafer having patterned thereon the plurality of test patterns 22 through exposure is developed.

Next, the dimensions of the thus-developed test patterns 22 are measured through use of a critical dimension measurement SEM.

Here, in connection with each of the test patterns 22, the dimension La of the bottom of the isolated resist pattern, which corresponds to the first test pattern 221 and has a line width of 0.24 μm (hereinafter referred to as a "dimension La of an isolated line"), is measured. Further, the dimension Lb of the bottom of the line/space resist pattern, which corresponds to the second test pattern 222 and has a line width of 0.24 μm and a line pitch (space) of 0.24 μm (hereinafter referred to as a "dimension Lb of a line bottom"), is measured. Further, the dimension Lbt of the top of the line/space pattern (hereinafter referred to as a "dimension Lbt of a line top") is measured.

Thus, in a case where the focus offset value is taken as a parameter, the dimensions La, Lb, and Lbt of each of the test patterns 22 patterned through use of respective focus offset values are measured.

As shown in FIG. 4, on the basis of the measurement results, there can be prepared a plot showing the relation between respective focus offset values and the dimensions La, Lb, and Lbt of respective test patterns. The plot is prepared by the computation section 7.

Next, management of the focus offset values will now be described.

First, the product wafer coated with resist is set on the stage 5.

Next, through use of the reticle 2 shown in FIGS. 2A through 2C, the product pattern 21 and the test patterns 22 for managing a focus offset values are patterned onto the product wafer 4.

Here, the dimensions of the test patterns 22 change with a change in the focus offset value. More specifically, when the focus offset value of the projection optical system 3 (see FIG. 1) is changed, the dimension of the test pattern 22 formed on the product wafer 4 also changes.

The test pattern 22 comprises the first test patterns 221 whose dimensions change greatly with a change in the focus offset value, and the second test patterns 222 whose dimensions change little with a change in the focus offset value (see FIG. 2B).

As shown in FIG. 2C, an isolated line pattern having a line width of, for example, 0.24 μm is used as the first test pattern 221. A line/space pattern having a line width of 0.24 μm and a line pitch (space) of 0.24 μm is used as the second test pattern 222.

The product wafer 4 having patterned thereon the product pattern 21 and the test pattern 22 is now developed.

The dimension of the first test pattern 221 and the dimension of the second test pattern 222, the first and second test patterns 221 and 222 being developed and formed on the product wafer 4, are measured through use of a critical dimension measurement SEM.

Hore specifically, the dimension La of the bottom of the isolated resist line pattern (hereinafter referred to as a "dimension La of the isolated line"), which corresponds to the first test pattern 221 and has a line width of 0.24 μm, is measured. The dimension Lb of the bottom of the line/space pattern, which corresponds to the second test pattern 222 and has a line width of 0.24 μm and a line pitch (space) of 0.24 μm (hereinafter referred to as a "dimension Lb of the line bottom"), is measured.

As shown in FIG. 4, even when the focus offset value is shifted in either direction; that is, a positive direction or a negative direction, the dimension La and the dimension Lb assume the same value. Therefore, there arises a problem of inability to determine a direction in which the focus offset value is shifted.

Figure 5:
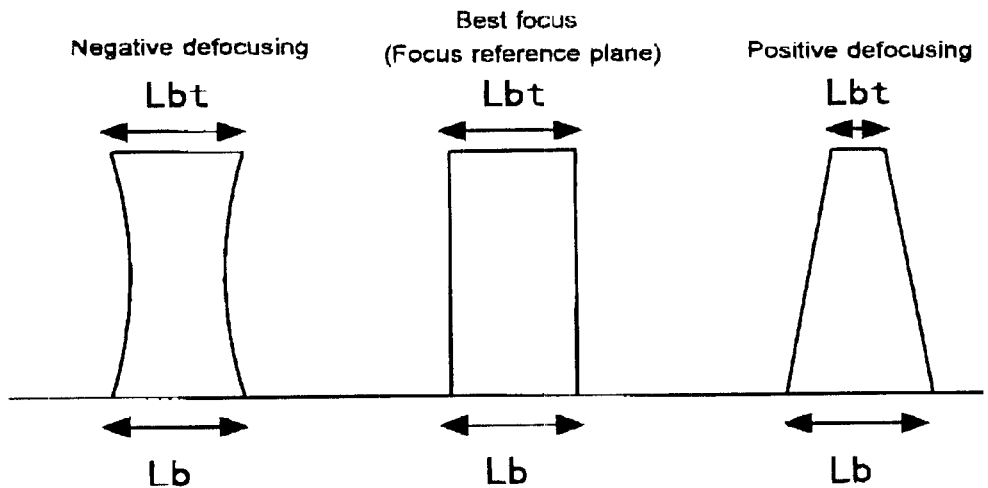
FIG. 5 is a drawing for describing a relation between shift of a focus offset value and a profile of line/space pattern, according to a second embodiment of the present invention.
Figure 6:
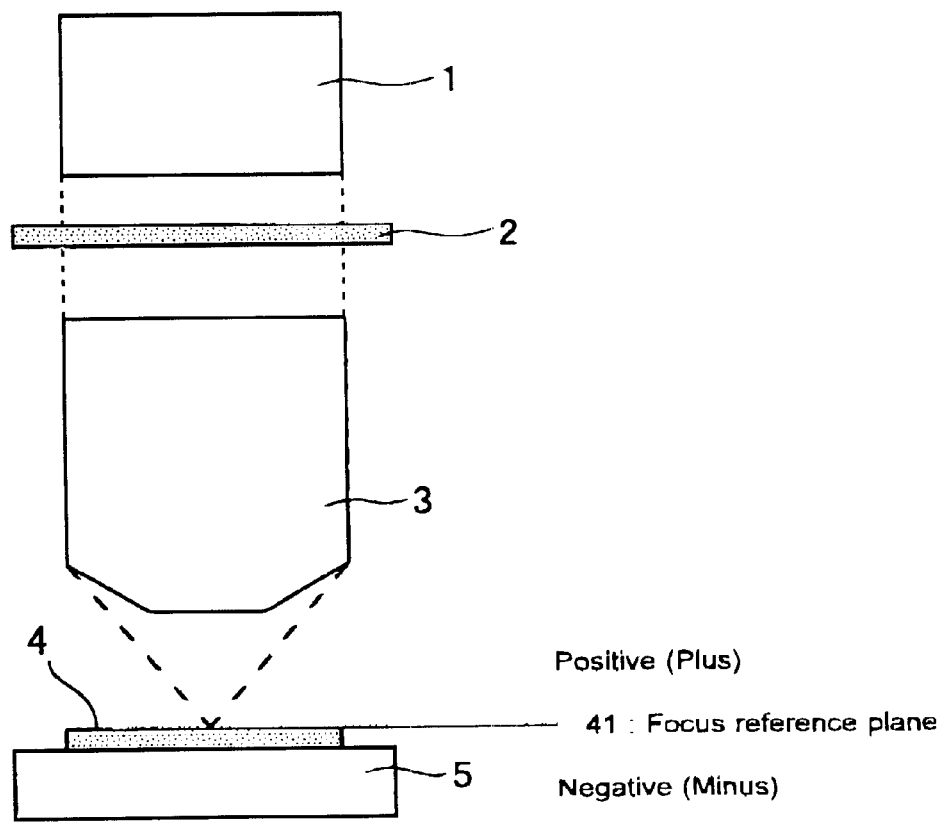
FIG. 6 is a cross-sectional view for describing a conventional system for manufacturing a semiconductor device.

As shown in FIG. 5, the line/space pattern, which corresponds to the second test pattern 222 and has a line width of 0.24 μm and a line pitch (space) of 0.24 μm, has the property of causing a great difference in the geometry of a line pattern between the case where the focus offset value is shifted in a positive direction (i.e., at the time of positive defocusing) and the case where the focus offset value is shifted in a negative direction (i.e., at the time of negative defocusing).

More specifically, the dimension Lbt of the top of the resist line pattern is measured, thereby determining the direction in which the focus offset value is shifted.

Next, A dimensional difference (Lb−La) is computed on the basis of the thus-measured dimensions La and Lb.

Further, from the thus-determined difference (Lb−La), the focus offset value is determined Specifically, the thus-determined difference (Lb−La) is compared with the plot showing the relation between the dimensions La and Lb with reference to the focus offset value (see FIG. 4), thus determining a focus offset value.

Further, the direction in which the focus offset value is shifted is determined on the basis of the dimension Lbt.

Next, the focus offset value set in the projection optical system 3 of the system for manufacturing a semiconductor device is adjusted so as to become identical with the thus-determined focus offset value, by means of the adjustment section 6.

Therefore, The thus-adjusted focus offset value is reflected in exposure to which product wafers 4 of the next lot are to be subjected.

As described above, in the method of manufacturing a semiconductor device according to the second embodiment, the product pattern 21 and the test pattern 22 for managing a focus offset value are patterned simultaneously onto the product wafer 4 by means of exposure.

Next, the product wafer 4 is developed, and the dimension of the thus-produced test pattern 22 is measured. Further, on the basis of the dimension of the test pattern 22, a focus offset value is determined.

Next, the thus-determined focus offset value is fed back to the projection optical system 3 of the system for manufacturing a semiconductor device. On the basis of the focus offset value, products of the next lot are manufactured in the system.

Accordingly, the focus offset value can be managed in conjunction with manufacture of products, thereby shortening down time of the system for manufacturing a semiconductor device. Consequently, the availability factor of the system for manufacturing a semiconductor device is significantly can be improved. In association with an increase in availability factor of the system for manufacturing a semiconductor device, the cost of manufacturing a semiconductor device can be suppressed.

The thus-determined focus offset value is immediately fed back to the system for manufacturing a semiconductor device. Accordingly, a focus offset value can be managed in real time, and a change in the focus offset value can be compensated for immediately. The product pattern, which is patterned onto the product wafer by means of exposure, can be accurately and constantly maintained. Therefore, the reliability of a product (semiconductor device) can be improved.

The second embodiment utilizes the phenomenon that the dimension of a resist pattern changes with a change in a focus offset value. To this end, a dimensional difference (Lb−La) is determined from the dimensions La and Lb of the test pattern, thereby determining a focus offset value. In order to determine a direction in which the focus offset value is shifted, the dimension Lbt of the top of the resist pattern is measured.

Only the dimension La of an isolated line, the dimension Lb of bottom of a line/space pattern, and the dimension Lbt of top of a line/space pattern, all the lines being included in a single test pattern 22, are to be measured. Therefore, the time required for managing a focus offset value can be significantly shortened.

Further, the dimension of the test pattern 22 is measured along with ordinary measurement of dimension of the product pattern 21. Consequently, no increase arises in the number of processing steps.

A plurality of test patterns 22 for leveling purposes are simultaneously patterned onto a wafer by means of a single shot. Therefore, there is no necessity for repeatedly exposing a wafer, which until now has been required. Thus, a stage can be easily leveled.

A bare silicon wafer coated with resist may be used in lieu of the product wafer 4.

Here, the pattern of the reticle 2 is patterned onto the bare silicon wafer by means of only a single shot. The focus offset value can be easily managed by means of measurement of only dimensions of the first and second patterns 221 and 222 included in the single test pattern 22; more specifically, the dimensions La, Lb, and Lbt.

Therefore, the time required for managing the focus offset value can be significantly shortened as compared with the conventional management of the focus offset value.

In the second embodiment, the dimension of the first test pattern 221 (i.e., the dimension La of an isolated line) and the dimension of the second test pattern 222 (i.e., the dimension Lb of bottom of a line/space pattern) are measured. A focus offset value is determined by means of a dimensional difference (Lb−La). The focus offset value may be determined from only the dimension of the first test pattern 221 (i.e., the dimension La of an isolated line).

The method of managing a focus offset value according to the present invention can also be applied to formation of a resist pattern to be used for forming a hole. Even in this case, a focus offset value can be managed by means of a test pattern patterned onto a product wafer. Therefore, the availability factor of a system for manufacturing a semiconductor device can be improved.

In the first and second embodiments, the line width of an isolated line pattern, the line width of a line/space pattern, and a line pitch between line/space patterns are set to a value of 0.24 $\mu$m. The present invention is not limited to such a value and the value may be changed as required.

This invention, when practiced illustratively, in the manner described above, provides the following major effects.

According to a first aspect of the present invention, the focus offset value can be managed in conjunction with manufacture of semiconductor products. Therefore, the availability factor of a system for manufacturing a semiconductor device can be improved.

In a preferred variation of the present invention, the focus offset value can be readily determined from a change in the dimensions of test patterns.

In a preferred variation of the present invention, the focus offset value of the projection optical system can be adjusted on the basis of dimensions of the test patterns patterned onto a product wafer.

In a preferred variation of the present invention, since a plurality of test patterns for leveling purpose can be patterned by means of a single shot, a stage can be leveled easily.

In a preferred variation of the present invention, the focus offset value can be managed in conjunction with manufacture of semiconductor products. Therefore, the availability factor of a system for manufacturing a semiconductor device can be improved. Further, the focus offset value can be monitored at all times.

In a preferred variation of the present invention, the focus offset value can be easily determined from the dimensions of test patterns.

In a preferred variation of the present invention, the focus offset value can be easily determined from the dimension of a first test pattern and the dimension of a second test pattern.

In a preferred variation of the present invention, the focus offset value, which has been determined on the basis of dimensions of test patterns, can be reflected in manufacture of products of the next lot.

In a preferred variation of the present invention, the direction in which a focus offset value is shifted can be easily determined.

In a preferred variation of the present invention, the stage can be easily leveled in conjunction with manufacture of semiconductor products.

In a preferred variation of the present invention, the focus offset value can be managed through use of a bare silicon wafer coated with resist.

In a preferred variation of the present invention, the focus offset value can be managed in conjunction with manufacture of semiconductor products. Therefore, the reliability of a semiconductor device can be improved.

Further, the present invention is not limited to these embodiments, but variations and modifications may be made without departing from the scope of the present invention.

The entire disclosure of Japanese Patent Application No. 2000-235293 filed on Aug. 3, 2000 containing specification, claims, drawings and summary are incorporated herein by reference in its entirety.

What is claimed is:

1. A system for manufacturing a semiconductor device comprising:

a stage for supporting a product wafer;

an illumination system for emanating exposure light;

a reticle that has drawn thereon a test pattern for managing a focus offset value and a product pattern, and through which the light originating from said illumination system passes;

a projection optical system for projecting, onto said product wafer and at a desired focus offset value, light that has passed through said test pattern and said product pattern drawn on said reticle; and an adjustment section for adjusting said focus offset value of said projection optical system on the basis of a dimension measurement result of the projected test pattern projected on said product wafer.

2. The system for manufacturing a semiconductor device according to claim 1, wherein said test pattern of said reticle comprises a first test pattern having a first dimension and a second test pattern having a second dimension, wherein said first test pattern dimension changes greatly with a change in said focus offset value, and wherein said second test pattern dimension changes little with a change in said focus offset value.

3. The system for manufacturing a semiconductor device according to claim 2, wherein said test pattern comprises an isolated line pattern as said first test pattern and a line/space pattern as said second test pattern.

4. The system for manufacturing a semiconductor device according to claim 2, further comprising:

a measurement section for measuring said dimension of said first test pattern and said dimension of said second test pattern, said first and second test patterns being patterned onto said wafer; and a computation section for computing a dimensional difference from said dimensions of respective test patterns measured by said measurement section and computing said focus offset value from said dimensional difference, wherein said adjustment section adjusts said focus offset value of said projection optical system on the basis of said focus offset value computed by said computation section.

5. The system for manufacturing a semiconductor device according to claim 1, wherein said test patterns are drawn in a plurality of locations on said reticle.

* * * * *